United States Patent
Hamakawa

[11] Patent Number: 5,881,002
[45] Date of Patent: Mar. 9, 1999

[54] NONVOLATILE MEMORY CONTROL CIRCUIT

[75] Inventor: Akira Hamakawa, Tokyo, Japan

[73] Assignee: Mitsubishi Denki Kabushiki Kaisha, Tokyo, Japan

[21] Appl. No.: 17,167

[22] Filed: Feb. 2, 1998

[30] Foreign Application Priority Data

Sep. 29, 1997 [JP] Japan .................................. 9-264184

[51] Int. Cl.⁶ ...................................................... G11C 7/00
[52] U.S. Cl. ..................................... 365/195; 365/185.04
[58] Field of Search ................................... 365/195, 196, 365/185.04, 189.07, 191

[56] References Cited

U.S. PATENT DOCUMENTS

| | | |
|---|---|---|
| 5,084,843 | 1/1992 | Mitsuishi et al. ........................ 365/195 |
| 5,097,445 | 3/1992 | Yamauchi ................................. 365/195 |
| 5,216,633 | 6/1993 | Weon et al. ......................... 365/189.07 |
| 5,396,471 | 3/1995 | Kitsu ....................................... 365/195 |
| 5,406,519 | 4/1995 | Ha ........................................... 365/195 |

FOREIGN PATENT DOCUMENTS

| | | |
|---|---|---|
| 5-173886 | 7/1993 | Japan . |
| 5-197627 | 8/1993 | Japan . |
| 8-77075 | 3/1996 | Japan . |

*Primary Examiner*—Son Mai
*Attorney, Agent, or Firm*—Burns, Doane, Swecker & Mathis, LLP

[57] ABSTRACT

A nonvolatile control circuit reads out data from a nonvolatile memory at a predetermined address upon power-up. When the read-out data is data that instructs inhibition of at least one of operations for writing, reading and erasing the nonvolatile memory, the operation designated by the data is inhibited from execution.

5 Claims, 16 Drawing Sheets

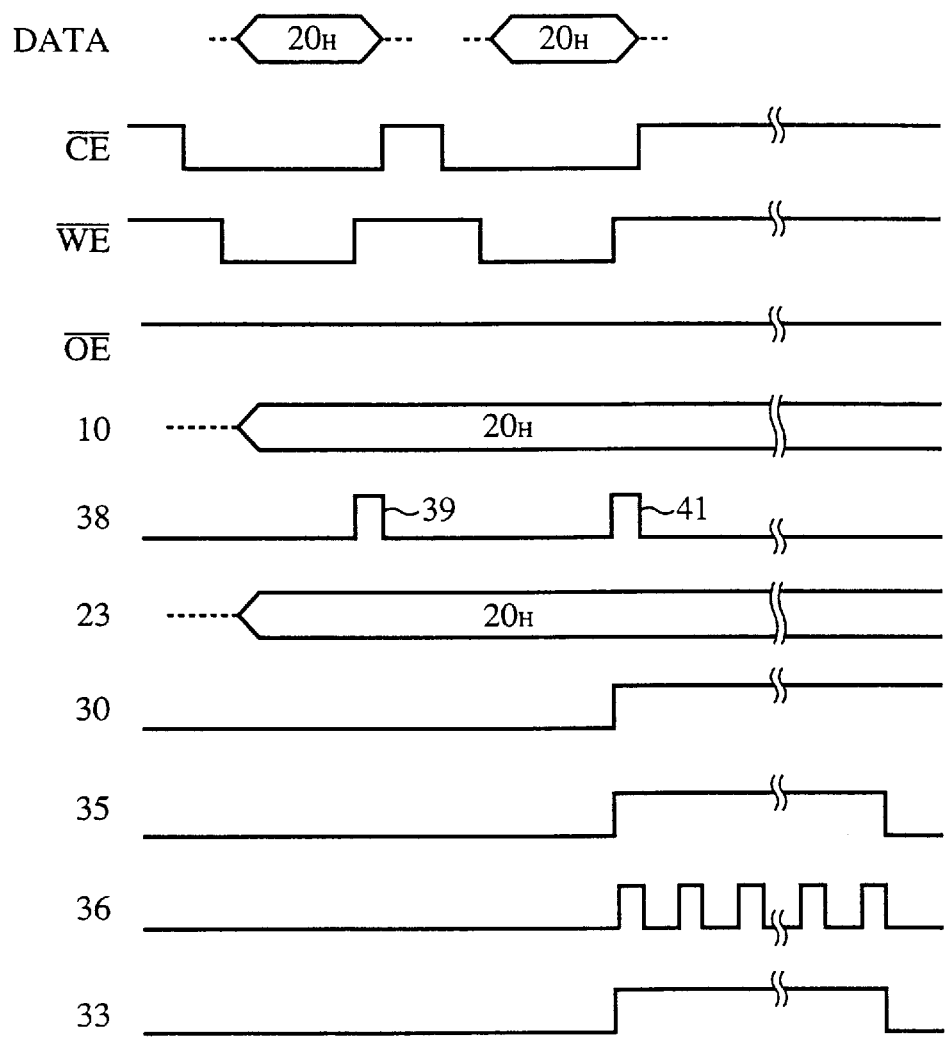

NONVOLATILE MEMORY CONTROL CIRCUIT

BACKGROUND OF THE INVENTION

1. Field of the Invention

The present invention relates to a nonvolatile memory control circuit mainly for an electrically erasable nonvolatile memory.

2. Description of the Prior Art

FIG. 14 illustrates in block form a conventional nonvolatile memory control circuit. In FIG. 14, reference to numeral 1 denotes a memory cell of an electrically erasable nonvolatile memory such as a flash memory, 2 a word decoder for decoding word lines that select addresses of the memory cell 1 in the horizontal direction, 3 a selector decoder for decoding a bit line selector 4 that selects addresses of the memory cell 1 in the vertical direction, and 4 the bit line selector that selects a bit line based on a selector decode signal from the selector decoder 3.

Reference numeral 5 denotes a data bus, 6 an address bus, 7 a data latch for latching a memory control command to be sent to the data bus 5 and data to be written in the memory cell, 8 an address latch for latching an address signal that specifies the address of the memory cell 2 for reading or writing it, 9 a write/read/erase control circuit for controlling a data write, read or erase operation of the memory cell 1, 10 a data bus, 11 an address bus, 12 an address latch signal generator that generates an address latch signal for latching an address signal on the address bus 6 in the address latch 8, 13 a signal line that conveys the address latch signal, 14 selector decode lines each for conveying the selector decode signal from the selector decoder 3, and 15 word decode lines each for conveying a word decode signal from the word decoder 2.

Reference numeral 16 denotes a chip enable signal generator for generating a chip enable signal $\overline{CE}$ that enables the nonvolatile memory control circuit to operate, 17 a signal line for conveying the chip enable signal $\overline{CE}$ from the chip enable signal generator 16, 18 an output enable signal generator for generating an output enable signal $\overline{OE}$ that enables data read out of the memory cell 1 to be provided onto the data bus 5 via the write/read/erase control circuit 9, 19 a signal line for conveying the output enable signal $\overline{OE}$, 20 a write enable signal generator for generating a write enable signal $\overline{WE}$ for latching command data that is input into the nonvolatile memory control circuit from the outside or data to be written in the memory cell 1, and 21 a signal line for conveying the write enable signal $\overline{WE}$. Reference numeral 22 denotes a command latch for latching command data on the data bus 10, 23 a data bus, 24 a command decoder for deciding whether the command data input via the data bus 23 is a write, read or erase command, 25 a write signal generator for generating a write signal for writing data in the memory cell 1, 26 a read signal generator for generating a read signal for reading out data from the memory cell 1, 27 an erase signal generator for generating an erase signal for erasing data on the memory cell 1, 28, 29 and 30 signal lines each for conveying a command decode signal from the command decoder 24, and 31, 32 and 33 signal lines for conveying the write signal, the read signal and the erase signal, respectively.

Reference numeral 34 a clock generator/frequency demultiplier for generating a clock on which the write/read/erase operation of the memory cell 1 is based, 35 and 36 signal lines for conveying the clock, 37 a command latch signal generator for generating a command latch signal, and 38 a signal line for conveying the command latch signal.

The operation of the conventional nonvolatile memory control circuit will be described below.

FIG. 15 is a timing chart showing the timing for writing data in the memory cell 1 of the traditional nonvolatile memory control circuit depicted in FIG. 14. In FIG. 15, reference numeral 39 indicates the command latch signal that is output onto the signal line 38 from the command latch signal generator 37, and 40 the address latch signal that is provided onto the signal line 13 from the address latch signal generator 12.

A data write to the memory cell 1 is carried out in two steps of processing the write command (a first cycle) and write data (a second cycle) both provided onto the data bus 5. More specifically, the command input operation in the first cycle begins with changing the chip enable signal $\overline{CE}$ on the signal line 17 from a logical value "1" to "0" and the write enable signal $\overline{WE}$ on the signal line 21 from a logical value "1" to "0." By this, the write/read/erase control circuit 9 goes into a command input waiting state. Next, command data "40H" (H representing the hexadecimal notation) for the write operation is input into the nonvolatile memory control circuit from the outside thereof and the write enable signal $\overline{WE}$ is changed from the logical value "0" to "1." As a result, the command latch signal 39 is provided onto the signal line 38 and the command latch 22 latches the command data "40H." The command latch signal 39 is output by one pulse only at this timing in the first cycle. Upon latching of the command data, the command decoder 24 decodes the command data and raises the write command decode signal on the signal line 28 up to the logical value "1." And the chip enable signal $\overline{CE}$ on the signal line 17 is raised from the logical value "0" to "1." Thus the command input operation of the first cycle is completed. This is followed by the second cycle operation of inputting write address data and write data. For example, in the case of writing data "00H" in the memory cell 1 at an address "4000H," an address signal "4000H" is input onto the address bus 6 from the outside and the chip enable signal $\overline{CE}$ on the signal line 17 and the write enable signal $\overline{WE}$ on the signal line 21 are each changed from the logical value "1" to "0". By this, when the write enable signal $\overline{WE}$ goes down to the logical value "0," the address latch signal 40 is provided onto the signal 13 from the address latch signal generator 12 and the write address of the memory cell 1 is latched in the address latch 8. At the point in time that the address signal "4000H" is input onto the address bus 6, the selector decode line 14 and the word decode line 15 are both already at the logical level "1" and the selection of these lines is determined at the point when the address latch signal 40 is output.

Next, the write data "00H" is input onto the data bus 5 from the outside. By changing the write enable signal $\overline{WE}$ from the logical value "0" to "1," the data "00H" is latched in the data latch 7. When the write address and the write data are latched in the address latch 8 and the data latch 7, respectively, a write signal is output onto the signal line 31 from the write signal generator 25 and at the same time a signal is provided on the signal line 35 to activate the clock generator/frequency demultiplier 34. Since the decode signals on the selector decode line 14 and the word decode line 15 corresponding to the address "4000H" are already at the logical level "1," the data "00H" is stored in the memory 1 at the address "4000H." The write signal goes down to the logical level "0" when the number of clock signals provided onto the signal line 36 from the clock generator/frequency demultiplier 34, counted by the write signal generator 25, reaches a predetermined value.

FIG. 16 is a timing chart that depicts the timing for reading out data from the memory cell 1 in the conventional nonvolatile memory control circuit shown in FIG. 14. As is the case with the data write, the command input for the data read operation is carried out only in the first one cycle.

The data read procedure begins with forcing the chip enable signal $\overline{CE}$ to the logical level "0," putting the write/read/erase control circuit 9 in the input waiting state. Then the write enable signal $\overline{WE}$ goes to the logical level "0," enabling read command data "10H" to be input onto the data bus 10 via the data latch 7 and output onto the data bus 23 via the command latch 22.

After this, when the write enable signal $\overline{WE}$ rises to the logical level "1," the command latch signal generator 37 generates the command latch signal 39, latching the read command data "10H" in the command latch 22. The command decoder 24 generates a signal of the logical level "1" onto the signal line when it decides that the data provided on to the data bus 23 is read command. The read signal generator 26 receives the signal on the signal line 29 and generates a read request signal of the logical level "1" onto the signal line 32. The write/read/erase control circuit 9 is switched by the read request signal into a read control state.

Thereafter, the address data "4000H" is input onto the address bus 6 and then output onto the address bus 11 after being once latched in the address latch 8. At a point in time the chip enable signal $\overline{CE}$ goes down to the logical level "0," the signal levels on the selector data code line 14 and the word decode line 15 corresponding to the address "4000H" are made high by the word decoder 2, the selector decoder 3 and the bit line selector 4. Following this, the output enable signal $\overline{OE}$ on the signal line 19 goes down to the logical level "0" and the write/read/erase control circuit begins the read operation. Thus the data stored in the memory cell 1 at the address "4000H" is read out therefrom and provided onto the data bus 5.

FIG. 17 is a timing chart that depicts the timing for erasing data from the memory cell 1. In FIG. 17, reference numeral 41 denotes a command latch signal that is provided onto the signal line 38 from the command latch signal generator 37 in the second cycle.

The erase operation executed by performing a data latch of two cycles at the same timing as in the write operation. A first step of the erase procedure consists of latching erase command data "20H" in the command latch 22 in the command input operation of the first cycle. The next step is to latch again the erase data "20H" in the command latch 22 in the command input operation of the second cycle. In consequence, the erase signal generator 27, which has received the decode signal provided twice in succession onto the signal line 30 from the command decoder 24, generates an erase signal onto the signal line 33. By this, the memory cell 1 is erased over the entire storage area thereof. The erase signal on the signal line 33 goes down to the logical level to "0" when the number of clock signals on the signal line 36 provided from the clock generator/frequency demultiplier 34, counted by the erase signal generator 27, reaches a predetermined value.

Since the conventional nonvolatile memory control circuit has such a configuration as described above, anyone can write, read or erase data if he or she follows a fixed procedure to enter a preset write, read or erase command. On the other hand, since anyone can erase data written in the memory cell, there is a fear of important data or programs stored in the memory cell being readily erased by a third party.

SUMMARY OF THE INVENTION

It is therefore an object of the present invention to provide a nonvolatile memory control circuit that prevents easy erasure of stored contents of a memory by a third party.

To attain the above objective, according to a first aspect of the present invention, there is provided a nonvolatile memory control circuit which reads out data from a nonvolatile memory at a predetermined address upon power-up and, if the read-out data designates the inhibition of at least one of write, read and erase operations of the nonvolatile memory, inhibits the operation specified by the data. With this nonvolatile memory control circuit, it is possible to protect the stored contents from being erased or overwritten and hence hold them in safety.

According to a second aspect of the present invention, there is provided a nonvolatile memory control circuit which further comprises a register for temporarily holding data read out of the nonvolatile memory at the predetermined address. This circuit configuration permits the decode operation of the command decoder without the necessity for routing many buses.

According to a third aspect of the present invention, there is provided a nonvolatile memory control circuit which permits write, read or erase operation of the nonvolatile memory in the case where a preset password stored in the nonvolatile memory at a first predetermined address is input into the control circuit and data stored in the memory at a second predetermined address is one that does not inhibit the write, read or erase operation of the memory. This permits the stored contents of the memory to be held in safety.

According to a fourth aspect of the present invention, there is provided a nonvolatile memory control circuit which is equipped with at least two command decoders for decoding commands of different systems so as to select the kind of the command each time. This circuit configuration completely inhibits write, read and erase operations of the nonvolatile memory by a person who knows only previous commands and safeguards the stored contents of the memory.

According to a fifth aspect of the present invention, there is provided a nonvolatile memory control circuit which is equipped with a first nonvolatile memory for storing usual data and a second nonvolatile memory for storing data for inhibiting data write, read and erase operations of the first nonvolatile memory. With this circuit configuration, even if wrong data is written in the second nonvolatile memory and the first nonvolatile memory cannot be erased or written accordingly, it is possible to write, read and erase the first nonvolatile memory after erasing the wrong data inadvertently written in the second nonvolatile memory.

BRIEF DESCRIPTION OF THE DRAWINGS

Other objects, features and advantages of the present invention will become more apparent from the following description taken in conjunction with the accompanying drawings, in which:

FIG. 17 is a timing chart depicting the timing for erasing data from the memory cell in the conventional nonvolatile memory control circuit of FIG. 14.

DETAILED DESCRIPTION OF THE PREFERRED EMBODIMENTS

The preferred embodiments of the present invention will hereinafter be described in detail in conjunction with the accompanying drawings.

EMBODIMENT 1

Figure 1:
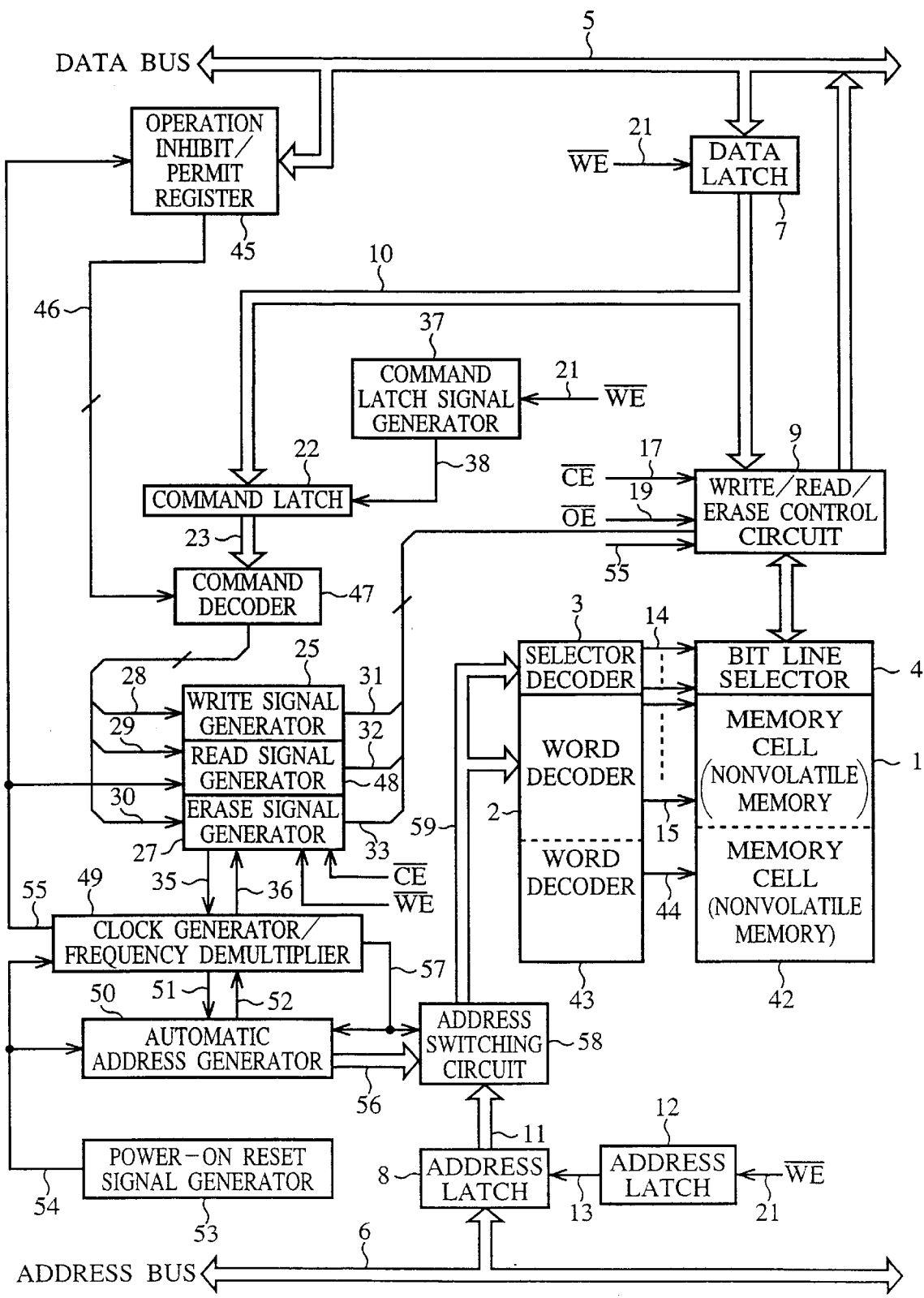
FIG. 1 is a block diagram illustrating part of the configuration of a nonvolatile memory control circuit according to Embodiment 1 of the present invention.

In FIG. 1, reference numeral 1 denotes a memory cell of an electrically erasable flash memory or similar nonvolatile memory (a nonvolatile memory), 2 a word decoder for decoding word lines that select addresses of the memory cell 1 in the horizontal direction, 3 a selector decoder for decoding a bit line selector 4 that selects addresses of the memory cell 1 in the vertical direction, and 4 the bit line selector that selects a bit line based on a selector decode signal from the selector decoder 3.

Reference numeral 5 denotes a data bus, 6 an address bus, 7 a data latch for latching a memory control command to be sent to the data bus 5 and data to be written in the memory cell, 8 an address latch for latching an address signal that specifies the address of the memory cell 2 for reading or writing it, 9 a write/read/erase control circuit (write/read/erase means) for controlling a data write, read or erase operation of the memory cell 1, 10 a data bus, 11 an address bus, 12 an address latch signal generator that generates an address latch signal for latching an address signal on the address bus 6 in the address latch 8, 13 a signal line that conveys the address latch signal, 14 selector decode lines each for conveying the selector decode signal from the selector decoder 3, and 15 word decode lines each for conveying a word decode signal from the word decoder 2.

Reference numeral 17 denotes a signal line for conveying the chip enable signal $\overline{CE}$, 19 a signal line for conveying the output enable signal $\overline{OE}$ and 21 a signal line for conveying the write enable signal $\overline{WE}$.

Reference numeral 22 denotes a command latch for latching command data on the data bus 10, 23 a data bus, 25 a write signal generator for generating a write signal for writing data in the memory cell 1, 27 an erase signal generator for generating an erase signal for erasing data on the memory cell 1, 28, 29 and 30 signal lines each for conveying a command decode signal from the command decoder 24, and 31, 32 and 33 signal lines for conveying the write signal, the read signal and the erase signal, respectively.

Reference numerals 35 and 36 denote signal lines for conveying the clock, 37 a command latch signal generator for generating a command latch signal, and 38 a signal line for conveying the command latch signal.

Reference numeral 42 denotes a memory cell of a specific address in the memory cell in which data to be stored in an operation inhibit/permit register 45 is written, 43 a dedicated word decoder provided as part of the word decoder 2 to read out data from the memory cell 42, 44 a word decode line for conveying a word decode signal from the word decoder 43, 45 the operation inhibit/permit register (a register) for storing data that represents the permission or inhibition of a data write or read or erase operation of the memory cell 1, 46 a signal line for conveying data read out of the operation inhibit/permit register 45, 47 a command decoder for deciding whether command data input therein via the data bus 23 is a command designating the data write, read or erase operation or data representing operation inhibition or permission, and 48 a read signal generator for generating a read signal for reading data from the memory cells 1 and 42.

Reference numeral 49 denotes a clock generator/frequency demultiplier (data read instructing means) that generates clock signals on which write/read/erase operations of the memory cells 1 and 42 are based, receives a control signal from a power-on reset signal generator 53 and generates control signals for the operation inhibit/permit register 45, the read signal generator 48, an automatic address generator 50 and an address switching circuit 58; 50 denotes the automatic address generator (address signal generator) that automatically generates address signals for the memory cells 1 and 42, based on a reset signal that is generated upon power-on and the clock signal from the clock generator/frequency demultiplier 49; 51 and 52 denote signal lines for conveying the clock signals; 53 denotes the power-on reset signal generator which automatically outputs a reset signal to a peripheral circuit upon power-up; and 54 denotes a signal line for conveying the reset signal from the power-on reset signal generator 53.

Reference numeral 55 denotes a signal line for conveying the control signal from the clock generator/frequency demultiplier 49, 56 an address bus for conveying the address signal from the automatic address generator 50, 57 a signal line for conveying the control signal from the clock generator/frequency demultiplier 49, 58 an address switching circuit for switching between the address signal input onto the address bus 6 from the outside and the address signal generated onto the address bus 56 from the automatic address generator 50, and 59 an address bus for conveying the address signal selectively output from the address switching circuit 58.

Figure 2:
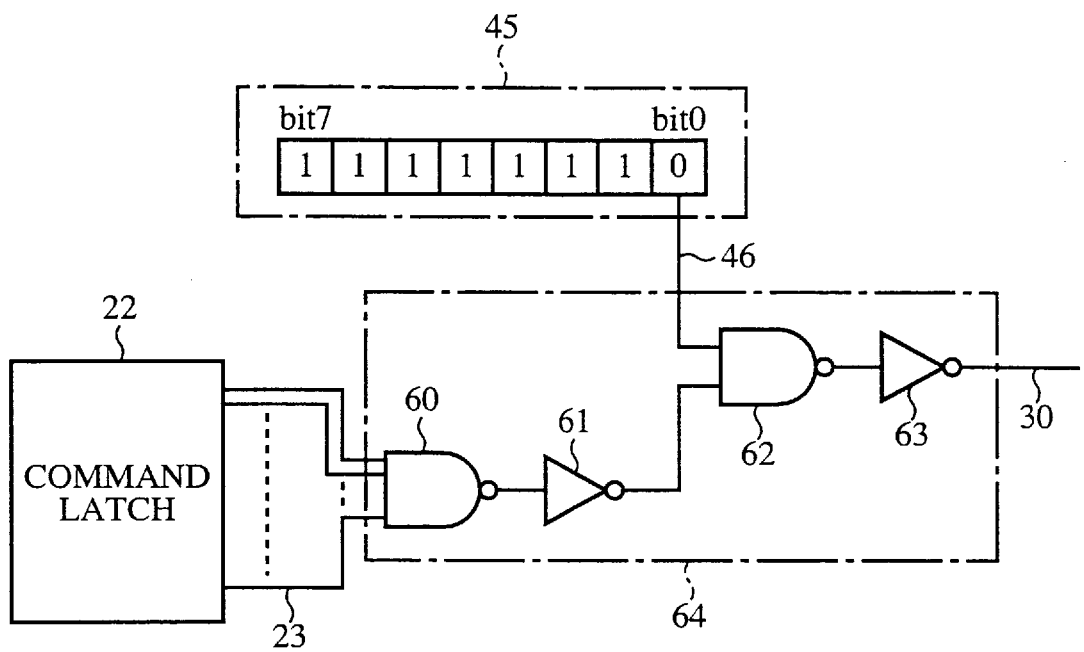
FIG. 2 is a circuit diagram depicting in detail an operation inhibit/permit register, a command latch and a command decoder in FIG. 1.
Figure 3:
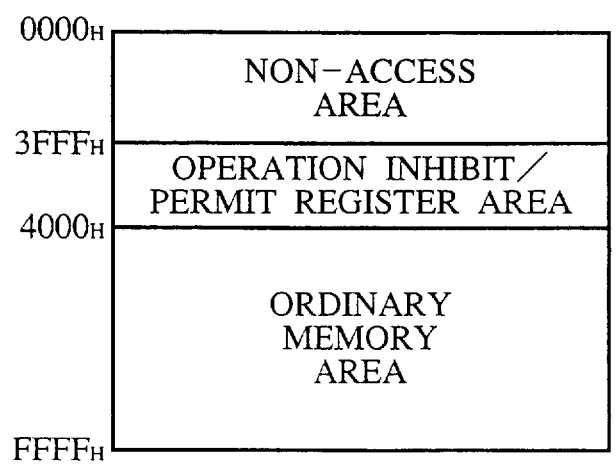
FIG. 3 is a diagram depicting in an address map form the relationship between a normal memory cell and an operation inhibit/permit register data storing memory cell in FIG. 1.

In FIG. 2, reference numerals 60 and 62 denote NAND circuits, 61 and 63 NOT circuit, and 64 an erase command decoder for decoding an erase command in the command decoder 47. The memory cell 1 in Embodiment 1 of the invention has a storage area from "4000H" to "FFFFH" in FIG. 3 and the memory cell for operation inhibit/permit use has an area "3FFFH."

Next, the operation of the nonvolatile memory control circuit of Embodiment 1 will be described.

Figure 4:
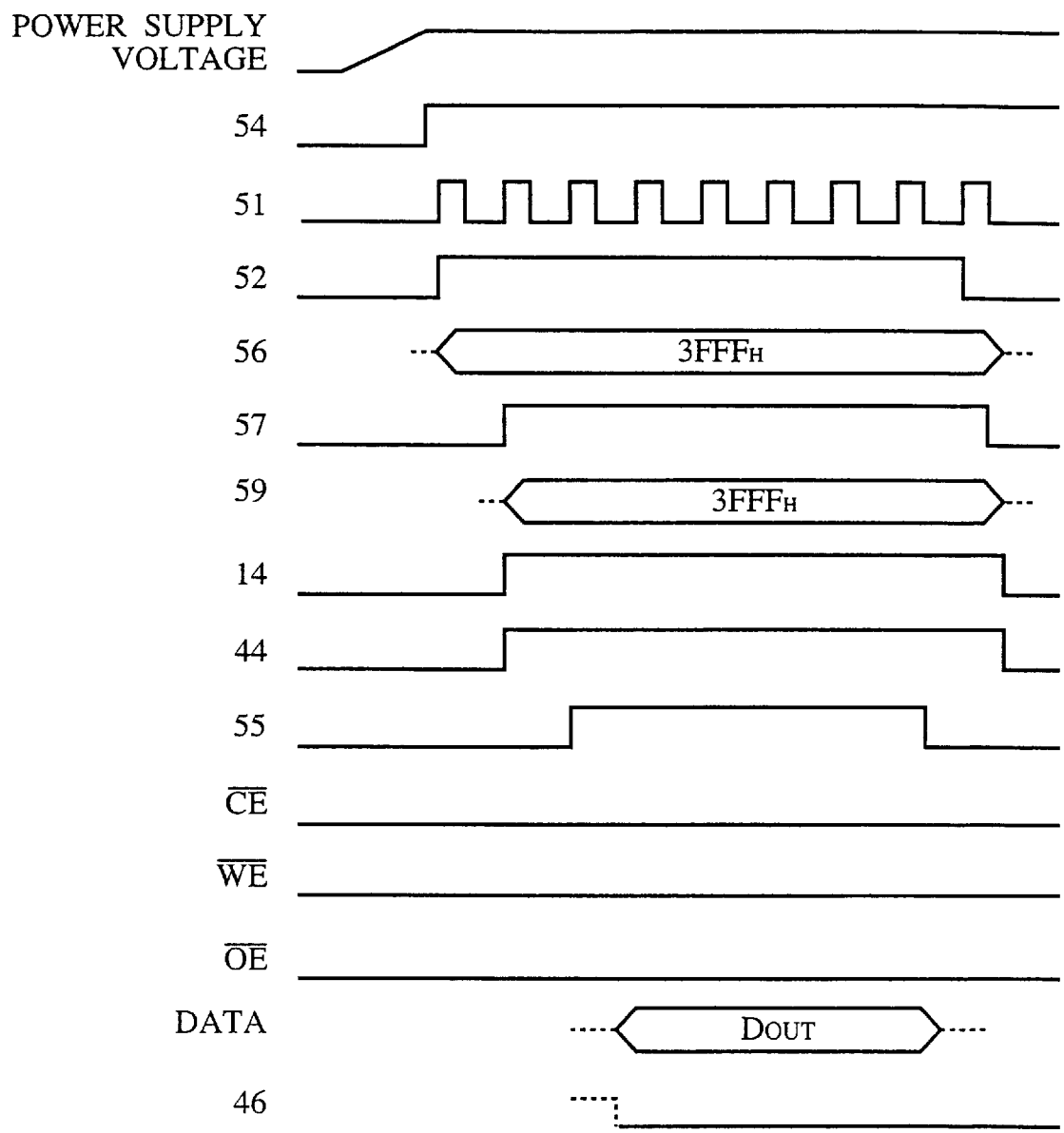
FIG. 4 is a timing chart showing the timing for reading data into the operation inhibit/permit register in the nonvolatile memory control circuit depicted in FIG. 1.

A description will be given first, with reference to FIGS. 1 and 4, of a method for reading out data from the memory cell 42 and storing it in the operation inhibit/permit register 45.

In FIG. 1, when the power supply voltage rises up to a predetermined value after power-on, the power-on reset signal generator 53 generates a power-on reset signal onto the signal line 54. The clock generator/frequency demultiplier 49 responds to the power-on reset signal to generate a clock signal onto the signal line 51. By the input thereto of this clock signal, the automatic address generator 50 generates onto the address bus 56 an address signal indicating the address "3FFFH" of the memory cell where operation inhibit/permit register data is being stored.

Then the clock generator/frequency demultiplier 49 provides via the signal line 57 to the address switching circuit 58 a signal requesting for switching to the automatic address side. By selecting the address signal generated onto the address bus 56 from the automatic address generator 50, the value on the address bus 59 for memory decode use becomes "3FFFH." As a result, the word decode line 44 and the selector decode line 14 corresponding to the address "3FFFH" go to the logical level "1" and the memory cell 42 is selected accordingly.

Further, the clock generator/frequency demultiplier 49 generates an operation inhibit/permit register read request signal onto the signal line 55. Data read out of the memory cell 42 in response to the read request signal is provided via the write/read/erase control circuit 9 onto the data bus 5. This read-out data is stored in the operation inhibit/permit register 45.

Figure 5:
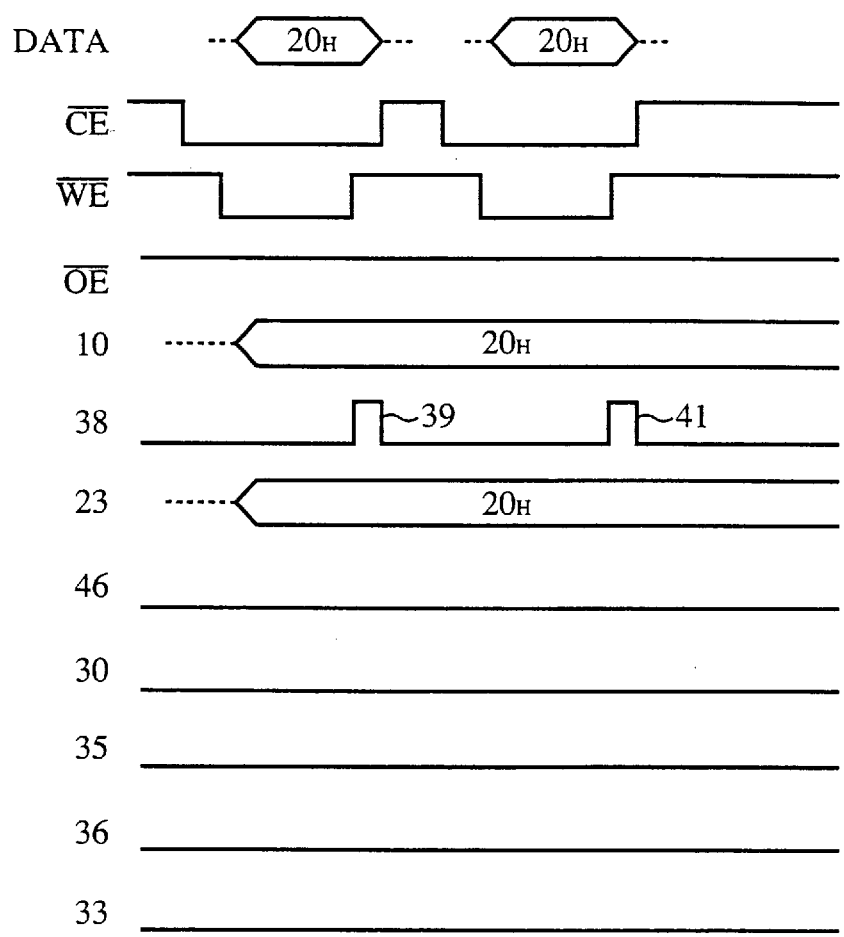
FIG. 5 is a timing chart showing the operation timing of inhibiting an erase operation in the nonvolatile memory control circuit of FIG. 1.

Turning now to FIGS. 2 and 5, an erase operation after data storage in the operation inhibit/permit register 45 will be described. The operation inhibit/permit register 45 and an erase command decoder 64 in the command decoder 47 have such circuit configurations as depicted in FIG. 2. In FIG. 2, a bit 0 of the operation inhibit/permit register 45 is assigned to an erase inhibit/permit bit. When the logical value of the bit 0 is "0," the signal level on the signal line 46 is "0" and consequently the erase signal on the signal line 30 is fixed at the logical level "0." As the result of this, as depicted in FIG. 5 that is an erase operation timing chart, although erase command data "20H" is latched in the command latch 22 in both first and second cycles, no erase signal is provided on the signal line 33 because the logical value of the erase inhibit/permit bit 0 is "0." Hence the memory cell 1 cannot be erased.

That is, writing data of logical value "0" in the memory cell 42 after writing a program or data in the memory cell 1 will protect the stored contents of the latter from accidental erasure. While in this embodiment the address of the memory cell 42 having stored therein the operation inhibit/permit data has been described to be "3FFFH," this address may be set in any area outside the normal memory area.

Next, data write and read operations will be described.

In this instance, power-on resetting after power-up is followed by automatic data storage in the operation inhibit/permit register 45 from the memory corresponding to the address "3FFFH" as is the case with the operation described above in respect of FIG. 4. After this, the clock generator/frequency demultiplier 49 applies via the signal line 57 to the address switching circuit 58 a signal requesting for switching to the address latch 8 side. Thus an address signal input from the outside is selected via the address bus 6, that is, latched in the address latch 8.

Figure 6:
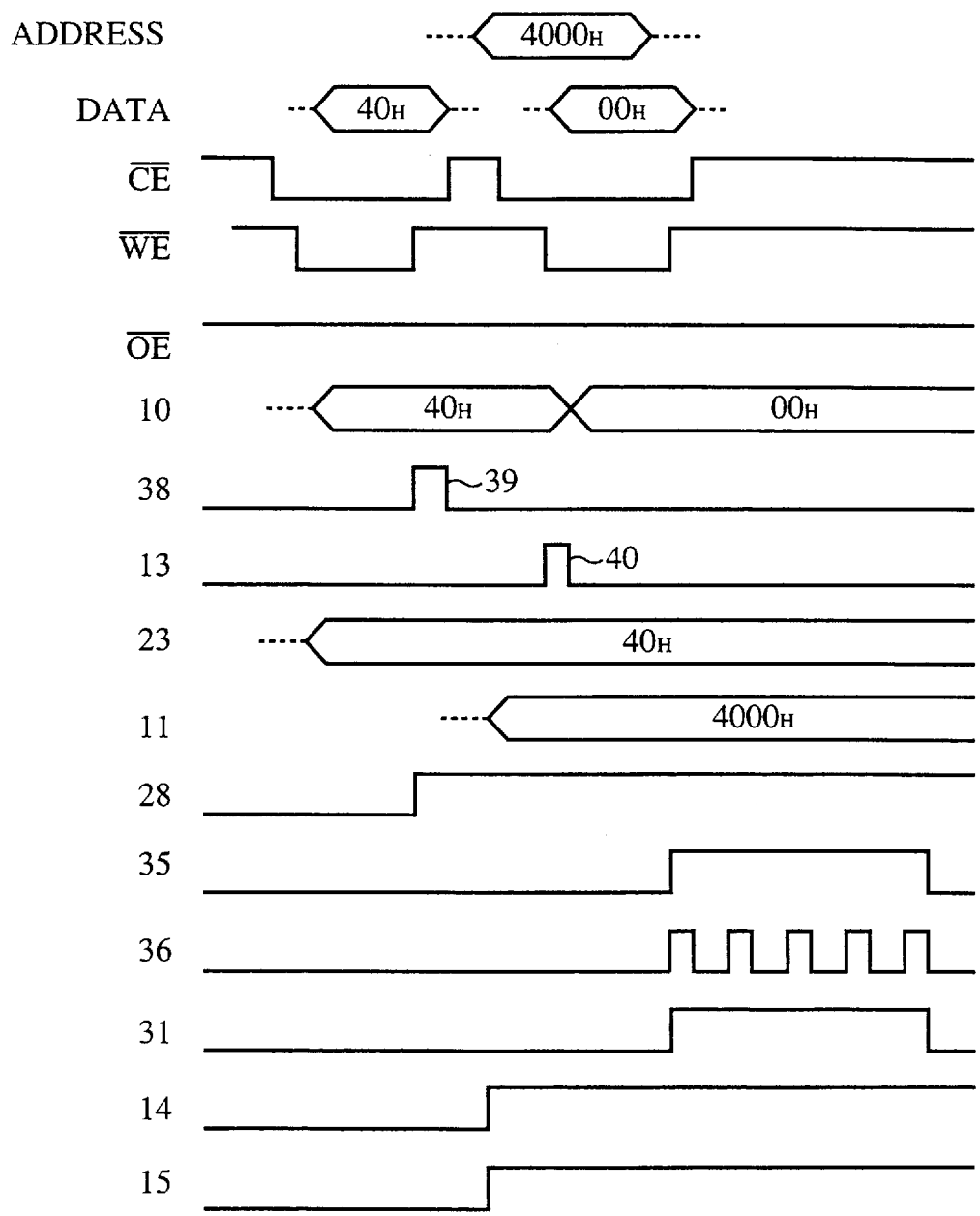
FIG. 6 is a timing chart showing the timing of writing data in the memory cell in the nonvolatile memory control circuit of FIG. 1.

In FIG. 6, reference numeral 39 denotes a command latch signal that the command latch signal generator 37 generates onto the signal line 38, and 40 an address latch signal that the address latch signal generator 12 generates onto the signal line 13.

A data write to the memory cell 1 is carried out in two steps of processing the write command (a first cycle) and write data (a second cycle) both provided onto the data bus 5. More specifically, the command input operation in the first cycle begins with changing the chip enable signal $\overline{CE}$ on the signal line 17 from the logical level "1" to "0" and the write enable signal $\overline{WE}$ on the signal line 21 from "1" to "0." By this, the write/read/erase control circuit 9 goes into a command input waiting state. Next, command data "40H" (H representing the hexadecimal notation) for the write operation is input into the nonvolatile memory control circuit from the outside thereof and the write enable signal $\overline{WE}$ is changed from the logical level "0" to "1." As a result, the command latch signal 39 is provided onto the signal line 38 and the command latch 22 latches the command data "40H." The command latch signal 39 is output by one pulse only at this timing in the first cycle. Upon latching of the command data, the command decoder 24 decodes the command data and raises the write command decode signal on the signal line 28 up to the logical level "1." And the chip enable signal $\overline{CE}$ on the signal line 17 is raised from the logical level "0" to "1." Thus the command input operation of the first cycle is completed.

This is followed by the second cycle operation of inputting write address data and write data. For example, in the case of writing data "00H" in the memory cell 1 at an address "4000H," an address signal "4000H" is input onto the address bus 6 from the outside and the chip enable signal $\overline{CE}$ on the signal line 17 and the write enable signal $\overline{WE}$ on the signal line 21 are each changed from the logical level "1" to "0". By this, when the write enable signal $\overline{WE}$ goes down to the logical level "0," the address latch signal 40 is provided onto the signal 13 from the address latch signal generator 12 and the write address of the memory cell 1 is latched in the address latch 8. At the point in time that the address signal "4000H" is input onto the address bus 6, the selector decode line 14 and the word decode line 15 are both already at the logical level "1" and the selection of these lines is determined at the point when the address latch signal 40 is output.

Next, the write data "00H" is input onto the data bus 5 from the outside. By changing the write enable signal $\overline{WE}$ from the logical level "0" to "1," the data "00H" is latched in the data latch 7. When the write address and the write data are latched in the address latch 8 and the data latch 7, respectively, a write signal is output onto the signal line 31 from the write signal generator 25 and at the same time a signal is provided on the signal line 35 to activate the clock generator/frequency demultiplier 34. Since the decode signals on the selector decode line 14 and the word decode line 15 corresponding to the address "4000H" are already at the logical level "1," the data "00H" is stored in the memory 1 at the address "4000H." The write signal goes down to the logical level "0" when the number of clock signals provided onto the signal line 36 from the clock generator/frequency demultiplier 34, counted by the write signal generator 25, reaches a predetermined value.

Figure 7:
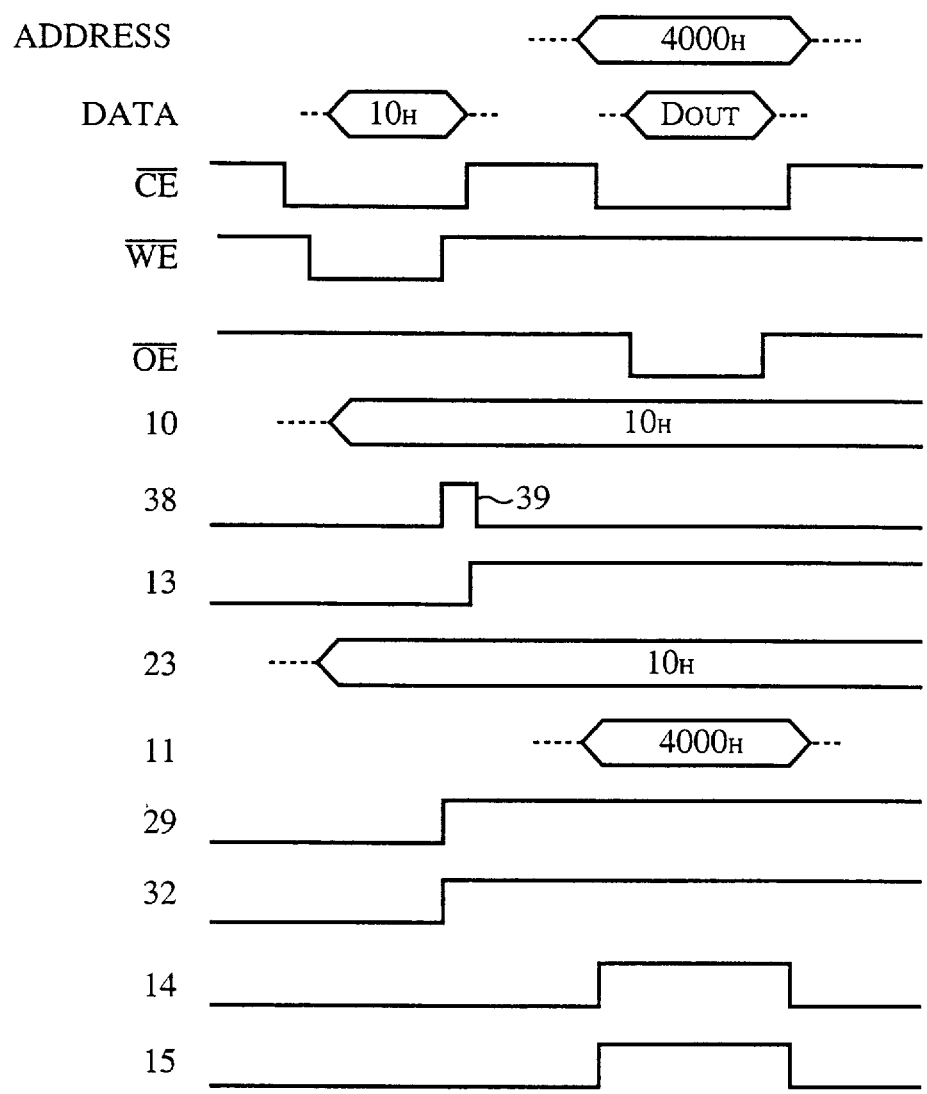
FIG. 7 is a timing chart showing the timing of reading out data from the memory cell in the nonvolatile memory control circuit of FIG. 1.

As depicted in FIG. 7, the command input for data read operation is carried out only in the first one cycle as is the case with the data write operation.

The data read procedure begins with forcing the chip enable signal $\overline{CE}$ to the logical level "0," putting the write/read/erase control circuit 9 in the input waiting state. Then the write enable signal $\overline{WE}$ goes to the logical level "0," enabling read command data "10H" to be input onto the data bus 10 via the data latch 7 and output onto the data bus 23 via the command latch 22.

After this, when the write enable signal $\overline{WE}$ rises up to the logical level "1," the command latch signal generator 37 generates the command latch signal 39, latching the read command data "10H" in the command latch 22. The command decoder 24 generates a signal of the logical level "1" onto the signal line when it decides that the data provided onto the data bus 23 is a read command. The read signal generator 48 receives the signal on the signal line 29 and generates a read request signal of the logical level "1" onto the signal line 32. The write/read/erase control circuit 9 is switched by the read request signal into a read control state.

Thereafter, the address data "4000H" is input onto the address bus 6 and then output onto the address bus 59 via the address latch 8 and the address switching circuit 58. At a point in time the chip enable signal $\overline{CE}$ goes down to the logical level "0," the signal levels on the selector data code line 14 and the word decode line 15 corresponding to the address "4000H" are made high ("1") by the word decoder 2, the selector decoder 3 and the bit line selector 4. Following this, the output enable signal $\overline{OE}$ on the signal line 19 goes down to the logical level "0" and the write/read/erase control circuit begins the read operation. Thus the data stored in the memory cell 1 at the address "4000H" is read out therefrom and provided onto the data bus 5.

As described above, according to Embodiment 1, data for inhibiting the erase operation is written in the memory cell 42 that stores data for the operation inhibit/permit register 45. At the time of power-on resetting this data is written int the operation inhibit/permit register 45, thereafter inhibiting erasure of the stored contents of the memory cell 1. This ensures protection of the stored contents from inadvertent erasure by a third party.

Of course, the command data for write/read/erase may take values other than the afore-mentioned.

EMBODIMENT 2

Figure 8:
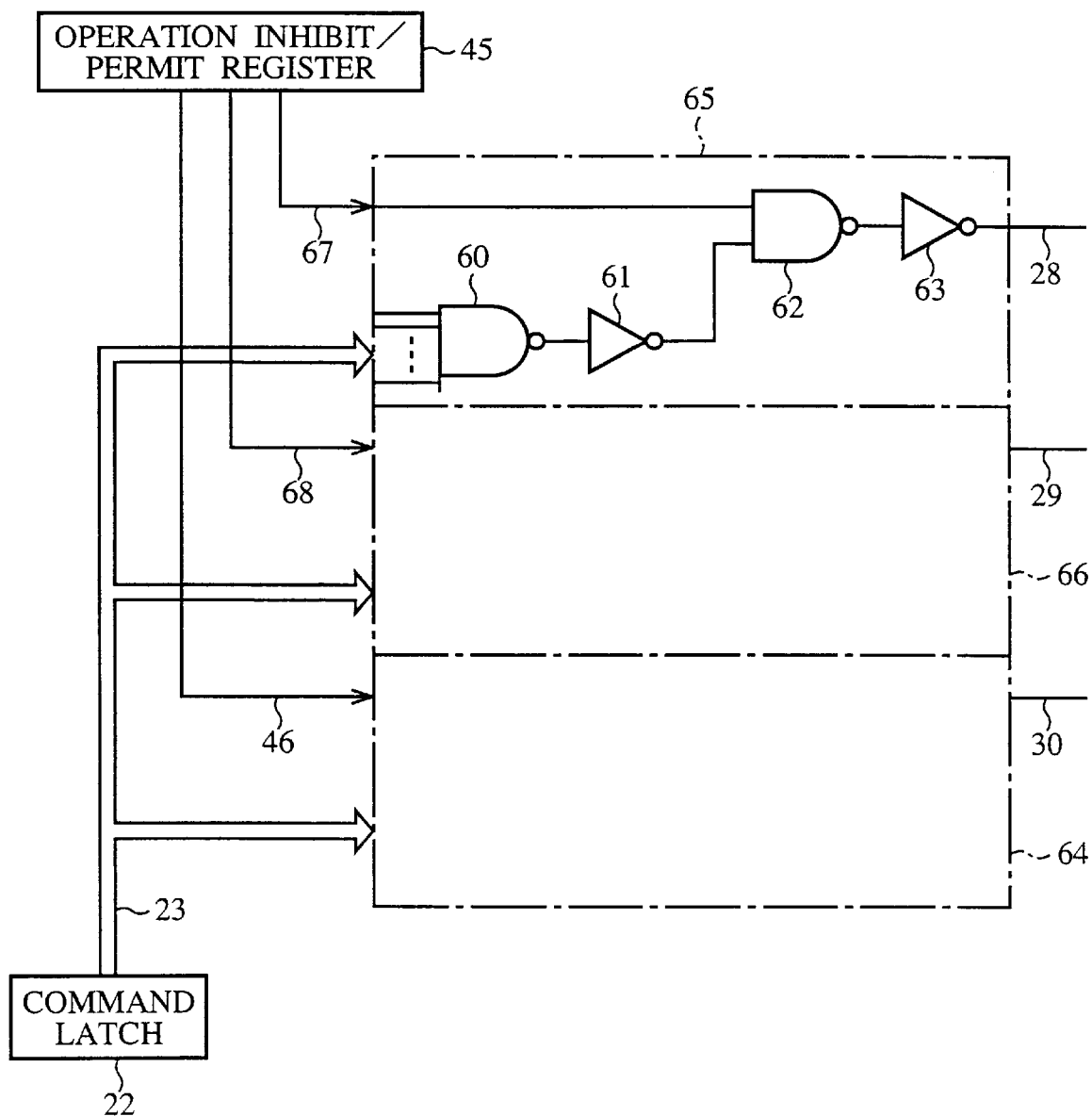
FIG. 8 is a circuit diagram illustrating part of the configuration of a nonvolatile memory control circuit according to Embodiment 2 of the present invention.

FIG. 8 schematically depicts parts corresponding to the operation inhibit/permit register 45, the command latch 22 and the command decoder 47 in the nonvolatile memory control circuit of Embodiment 1 shown in FIG. 1. In FIG. 8, reference numeral 65 denotes a write command decoder contained in the command decoder 47 to decode the write command, 66 a read command decoder for decoding the read command. These decoders are identical in construction with the erase command decoder 64. The bits 0, 1 and 2 of the operation inhibit/permit register 45 is set as write, read and erase inhibit/permit bits, respectively. These inhibit/permit bits may be set as desired. The other remaining components of the nonvolatile memory control circuit according to Embodiment 2 are identical with those of the control circuit according to Embodiment 1. The components identical with those in FIG. 2 are identified by the same reference numerals and no description will be given of them.

Next, the operation of this embodiment will be described.

Embodiment 1 selectively inhibits or permits the operation of the erase command decoder 64 alone. To this end, data is written in the bit 0 of the operation inhibit/permit register 45 to determine inhibition or permission of the erase operation. In Embodiment 2 the write and read operations as well as the erase operation can selectively be inhibited or permitted. Since the address of the memory cell 42 in which is written data to be stored in the operation inhibit/permit register 45 is the same as the address in the case of the erase operation, the timings for data read from the memory cell 42 and for data write to the operation inhibit/permit register 42 are the same as the operation timings in Embodiment 1. The timings for inhibiting other read, write and erase operations and for normal read, write and erase operations are also the same as the operation timings in Embodiment 1; hence, no description will be repeated.

As described above, Embodiment 2 makes it possible to inhibit a data overwrite in, a data read from and data erase in the memory cell 1, and hence it provides increased security for the stored contents of the memory cell 1.

EMBODIMENT 3

Figure 9:
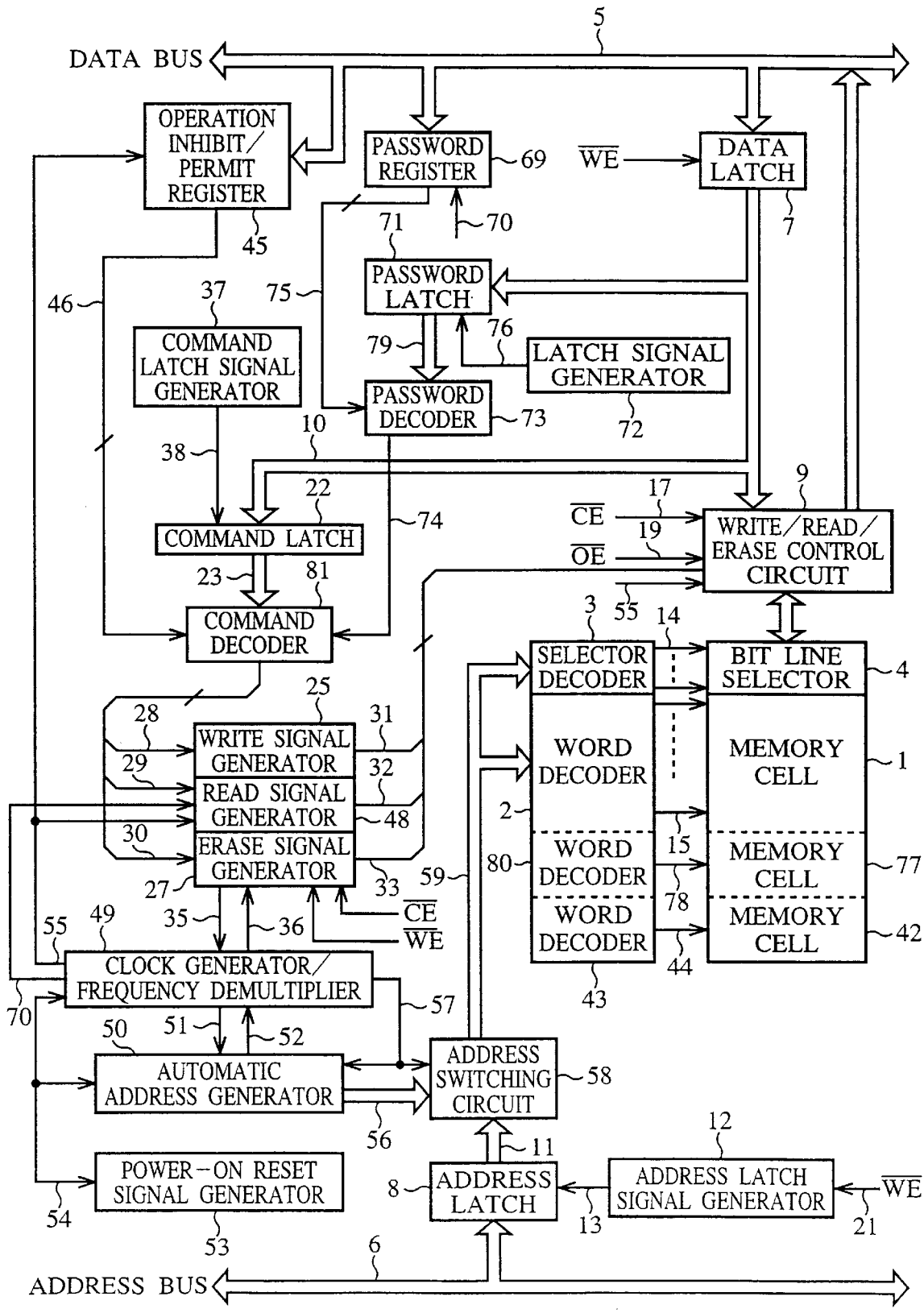
FIG. 9 is a block diagram illustrating part of the configuration of a nonvolatile memory control circuit according to Embodiment 3 of the present invention.

FIG. 9 illustrates in block form a nonvolatile memory control circuit according to Embodiment 3 of the present invention. The parts corresponding to those in Embodiment 1 are identified by the same reference numerals and no description will be given of the, In FIG. 9, reference numeral 69 denotes a password register for storing password data read out of the memory cell 1 after releasing the power-on resetting, 70 a signal line for conveying to the password register 69 a signal instructing it to write therein the password data, 71 a password latch for latching a password command, 72 a latching signal generator for generating a latch signal for the password latch 71, 73 a password decoder for making a comparison between the data stored in the password register 69 and the data stored in the password latch 71, 74 a signal line for conveying a password decode signal that goes to a "1" when the values in the password register 69 and the password latch 71 coincide, 75 a signal line for conveying data that is output from the password register 69, and 76 a signal line for conveying the latch signal to the password latch 71.

Reference numeral 77 denotes a memory cell provided in the memory cell 1 to store data to be written in the password register 69, 78 a signal line for conveying a signal that goes to a "1" when an address of the memory cell 77 is selected, 79 a signal line for conveying a password that is output from the password latch 71, 80 a dedicated word decoder provided as part of the word decoder 2 to read data from the memory cell 77, and 81 a command decoder which, only when passwords match, decides whether the command data input thereto via the data bus 23 is a command designating the write, read or erase operation or operation inhibit/permit indicating data.

Figure 10:
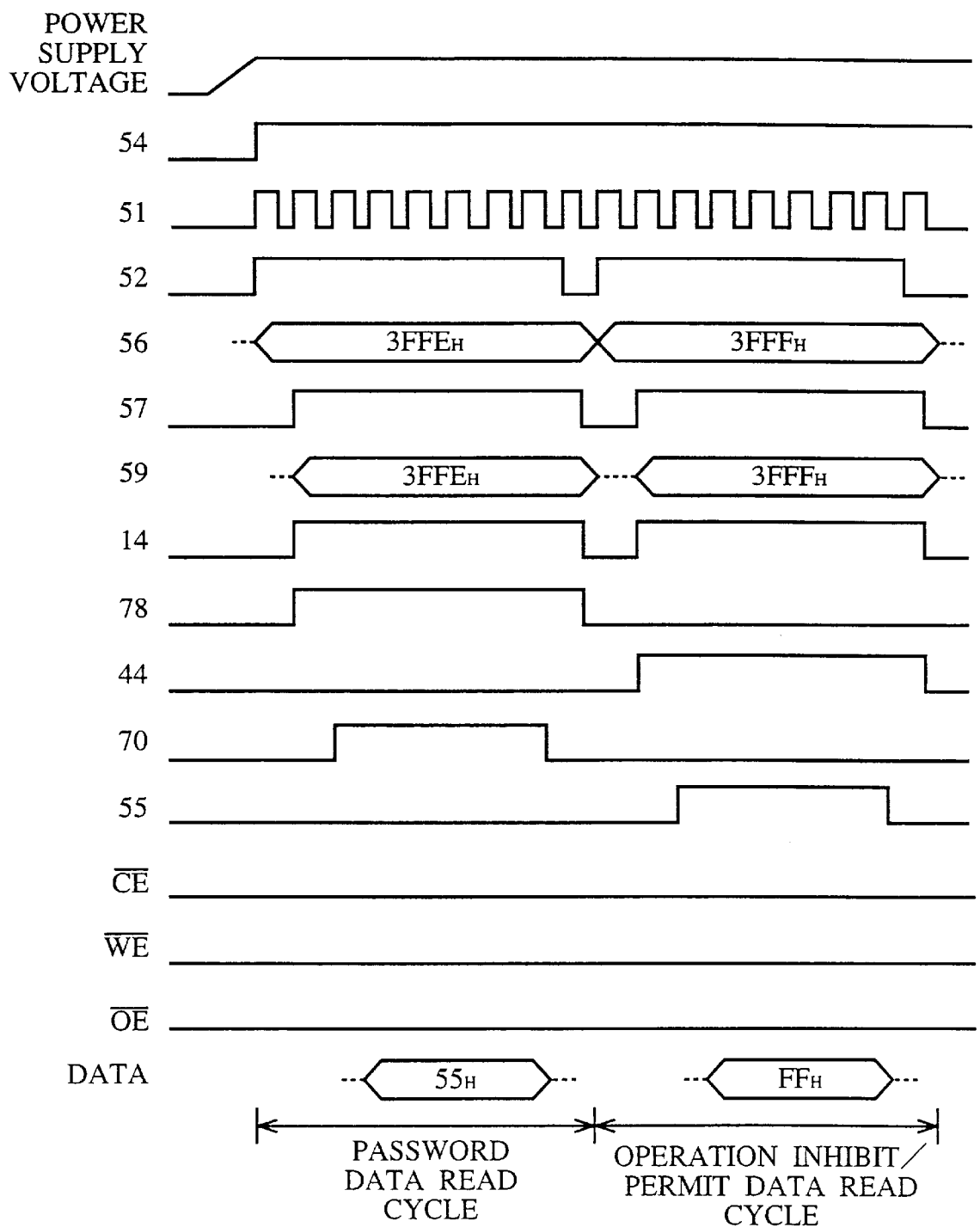
FIG. 10 is a timing chart showing the timing for reading out of the memory cell data to be stored in a password register and an operation inhibit/permit register and for storing the data in the respective registers in the nonvolatile memory control circuit according to Embodiment 3.
Figure 11:
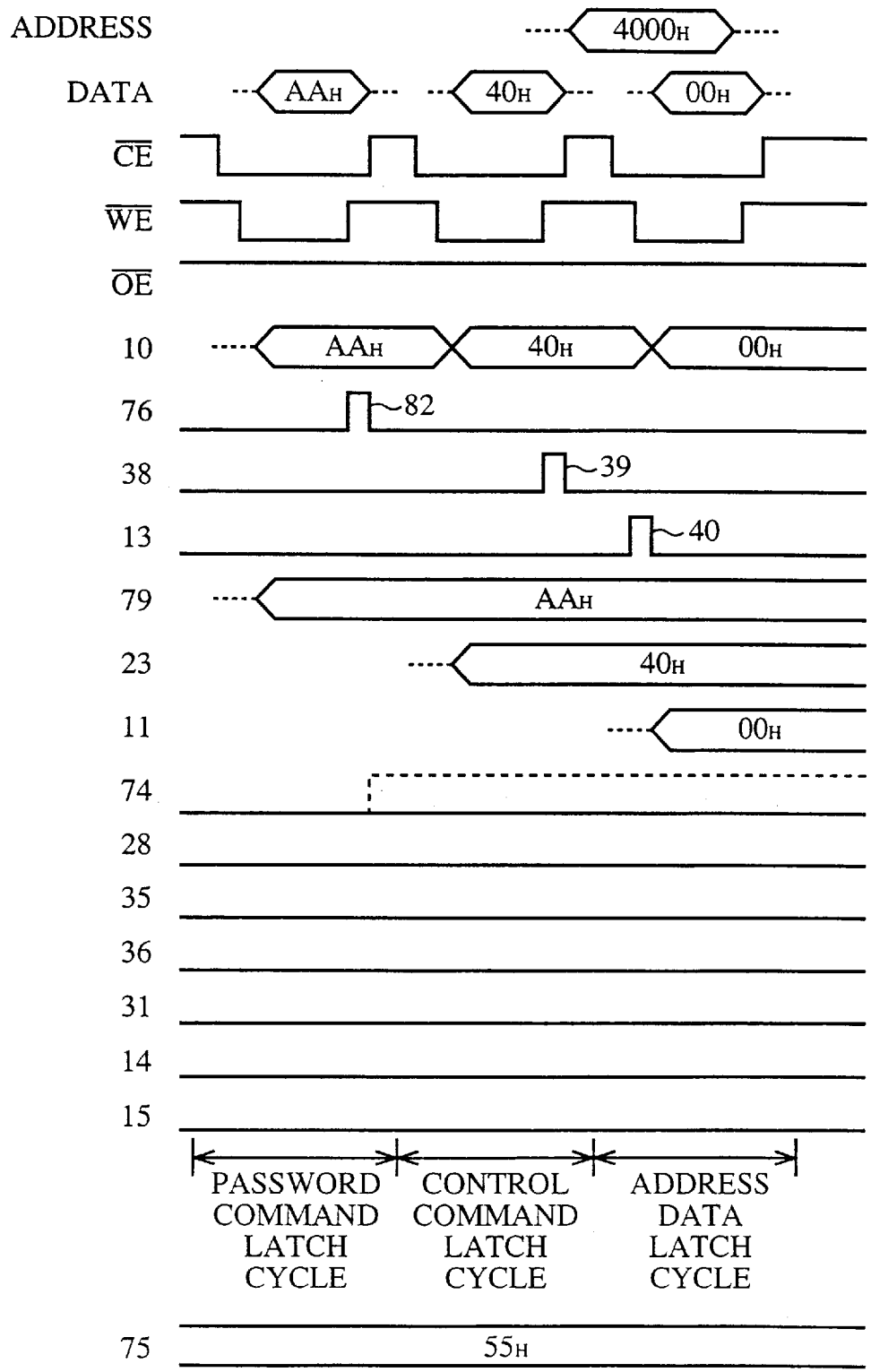
FIG. 11 is a timing chart showing the timing for a write operation when password data do not match in the nonvolatile memory control circuit according to Embodiment 3.

FIG. 10 depicts timings for reading out of the memory cell 1 the data to be stored in the password register 69 and the operation inhibit/permit register 45 and for storing the read-out data to the respective registers. FIG. 11 depicts the write operation timing when the passwords do not match.

The operation of this embodiment will be described below.

A description will be given first, with reference to FIGS. 9 and 10, of methods for reading out of the memory cells 42 and 77 data to be stored in the password register 69 and the operation inhibit/permit register 45 and for storing the read-out data in the respective registers. The methods for reading out data from the memory cells 42 and 77 and for storing the read-out data in the respective registers are basically identical with those used in Embodiment 1. In this embodiment, however, data spanning two addresses (memory cells 42 and 77) on the memory cell 1 is continuously read out therefrom and each data is stored in the password register 69 and the operation inhibit/permit register 45, respectively.

The storage area for the password data is disposed on the address ("3FFFH") contiguous to the address ("3FFFH") for storing data to be written to the operation inhibit/permit register 45. And the data spanning two addresses is continuously read out of the memory cells 42 and 77 in such a manner as shown in FIG. 4.

As depicted in FIG. 10, when the power supply voltage rises upon power-up, the power-on reset signal generator 53 generates a power-on reset signal onto the signal line 54. The clock generator/frequency demultiplier 49 responds to the power-on reset signal to generate a clock signal onto the signal line 51 for input into the automatic address generator 50. The automatic address generator 50 generates onto the address bus 56 an address signal representing the address "3FFFH" of the memory cell 77 where the password data is being stored.

Then the clock generator/frequency demultiplier 49 generates onto the signal line 57 a control signal for controlling the address switching circuit 58 to switch to the automatic address generator 50 side. By this, the address signal on the address bus 59 also takes the value "3FFFH" and signals of the logical level "1" are provided from the bit line selector 4 and the word decoder 80 onto the word decode line 78 and the selector decode line 14 corresponding to the address "3FFFH." Following this, the clock generator/frequency demultiplier 49 generates a signal of the logical level "1" onto the signal line 70. A read signal is provided from the read signal generator 48 to the write/read/erase control circuit 9 and the data stored in the memory cell 77 is read out onto the data bus 5. At the same time, the signal of the logical level "1" on the signal line 70 is also fed to the password register 69, in which the data read out onto the data bus 5 is written.

Following the readout of the password data, the automatic address generator 50 outputs the address "3FFFH" of the memory cell 1 where data for the operation inhibit/permit register 45 is being stored. As a result, the data read out of the memory cell 42 is stored in the operation/inhibit/permit register 45 in the same fashion as in Embodiment 1 depicted in FIG. 4.

Upon completion of the data storage in the respective registers, the nonvolatile memory control circuit enters the control command input waiting state.

Referring next to FIGS. 9 and 11, a description will be made of the operation of writing data to the memory cell 1 after storing the password data and the operation inhibit/permit data in the respective registers.

Now, let it be assumed that there are stored password data="55H" and operation inhibit/permit data="FFH" in the registers, respectively. The data stored in the password register 69 is used for comparison with data that is stored in the password latch 71 in the password decoder 73. Since there is stored the password data "55H" in the password register 69, the password decoder 73 provides a password decode signal onto the signal line 74 only when the data that is stored in the password latch 71 is "55H." The command decoder 81 decodes data from the command latch 22 only when the password decode signal is at the logical level "1."

The data write operation of the memory cell 1, which involves the input of the password command, is performed at such timing as depicted in FIG. 11. The password command latching operation is carried out at the same timing as that for latching the memory control command for the write/read/erase operation. But the commands are latched in order of input; that is, the password command is latched in the first cycle and the memory control commands in the second and subsequent cycles.

Upon input of the password command, for example, "AAH" (a value different from the data stored in the password register 69) in the first cycle, the latch signal generator 72 generates a latch signal 82 onto the signal line 76 and the data "AAH" is stored in the password latch 71. At this time the password decoder 73 makes a comparison between the data "55H" stored in the password register 69 and the data "AAH" in the password latch 71. In this instance, however, since the both data do not match, the password decode signal on the signal line 74 remains at the logical level "0."

Thereafter, in the second cycle write command data "40H" is stored and in the third cycle a write address "4000H" and write data "00H" are stored in the data latch 7 and the address latch 8. Since the password decode signal on the signal line 74 is at the logical level "0," the command decoder 81 does not decode the command data "40H" fed thereto from the command latch 22. Consequently, the write command decode signal on the signal line 28 also remains at the logical level "0." Hence, the data "00H" is not written in the memory and its stored contents cannot be rewritten. The same is true of the input of memory control commands for read and erase operations. When the value of the password command differs from the data stored in the password register 69, no memory control command is usable.

When the value of the password command matches the data stored in the password register 69, the password decode signal on the signal line 74 goes to the logical state "1" as indicated by the broken line in FIG. 11. This enables the command decoder 81 to decode the memory control commands, permitting the write/read/erase operation. That is, only a person who knows the stored data of the password register 69 and can enter the password data, i.e. only a person who wrote data in the memory cell 1, is entitled to control the memory cell 1. Accordingly, the stored contents of the memory cell 1 can be secured.

In the FIG. 11 example the contents stored in the operation inhibit/permit register 45 have been described to be set at "FFH" so that the memory control commands for write/read/erase after matching of the password data are all allowed. By writing an arbitrary value in the memory cell 42, however, it is possible to provide double protection of the stored contents of the memory cell 1 through the combined use of the password data and the operation inhibit/permit register. This takes the form of, for example, permitting the memory readout based on the password but inhibiting the memory write/erase by the operation inhibit/permit register. Hence the stored contents of the memory cell 1 can be held with increased security.

As described above, according to Embodiment 3, only a person who knows the password, i.e. a person who wrote the data in the memory cell 1, is entitled to access it. Thus, the contents of the memory cell 1 can be secured.

EMBODIMENT 4

Figure 12:
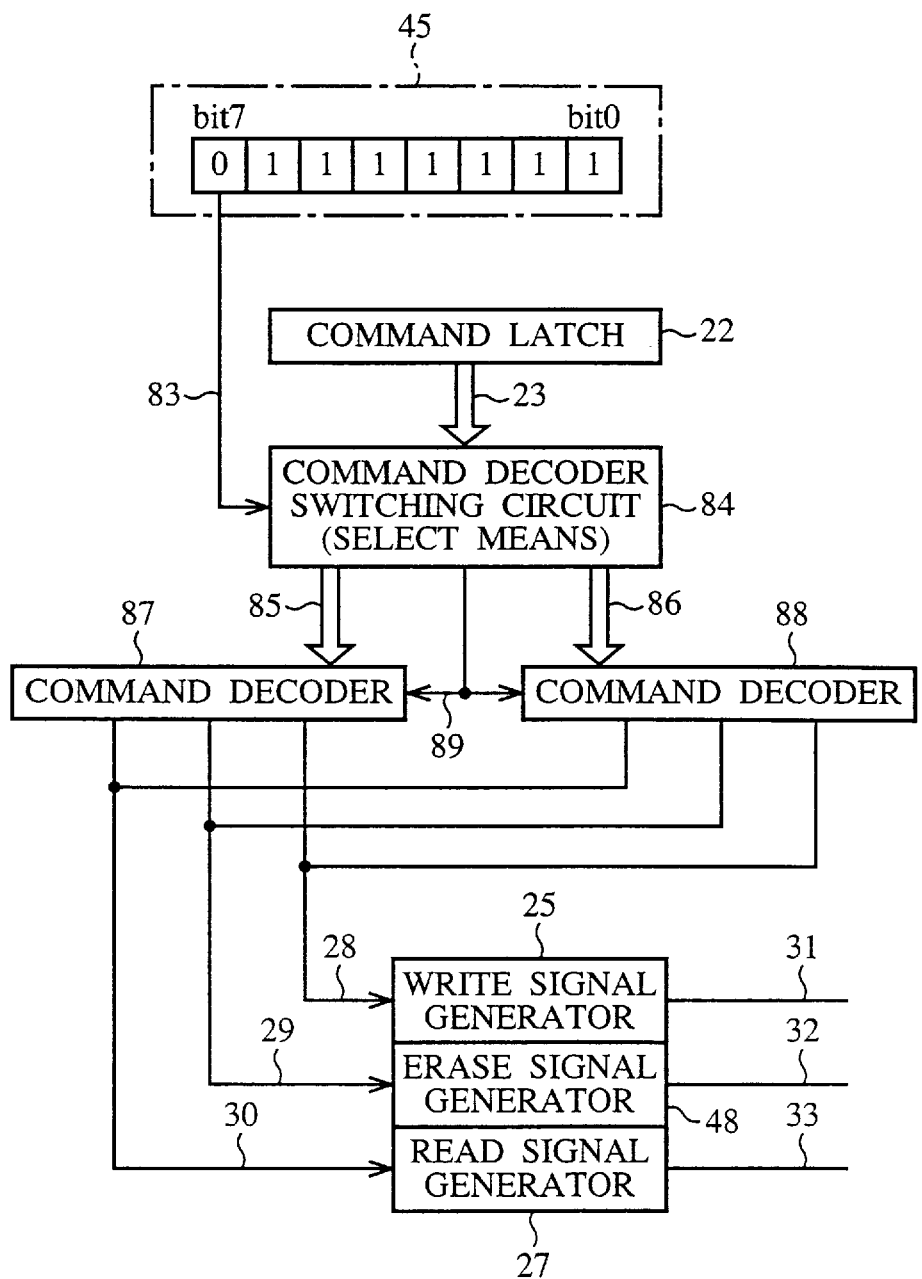
FIG. 12 is a block diagram illustrating part of the configuration of a nonvolatile memory control circuit according to Embodiment 4 of the present invention.

FIG. 12 illustrates in block form the principal part of the nonvolatile memory control circuit according to Embodiment 4 of the present invention.

In FIG. 12, reference numeral 83 a signal line connected to the bit 7 of the operation inhibit/permit register 45 to convey a signal that instructs switching between two command decoders, 84 a command decoder switching circuit (select means) for providing the data of the command latch 22 to a selected one of the two command decoders, 85 and 86 signal lines for conveying the command data from the command decoder switching circuit 84, 87 one of the two command decoder, 88 the other command decoder, and 89 a signal line for conveying a select signal to each of the command decoders 87 and 88. The other parts of this embodiment are the same as those in Embodiment 3.

The operation of this embodiment will be described below.

In Embodiments 1 and 2, once memory control operations are inhibited by writing data in the operation inhibit/permit register 45, it is quite impossible to carry out thereafter operations that the register 45 inhibits. In Embodiment 4, however, the command decoder 87 of the conventional command system and the command decoder 88 of an entirely different command system are prepared so that either one of them is selected according to the write data and consequently the value of the bit 7 of the operation inhibit/permit register 45 in this example. The write/read/erase operations can be accepted using data different from the conventional command data.

As described above, according to Embodiment 4, a person who has a knowledge of only the conventional commands will not be able to write, read and erase memory. This provides increased security for the stored contents of the memory.

EMBODIMENT 5

Figure 13:
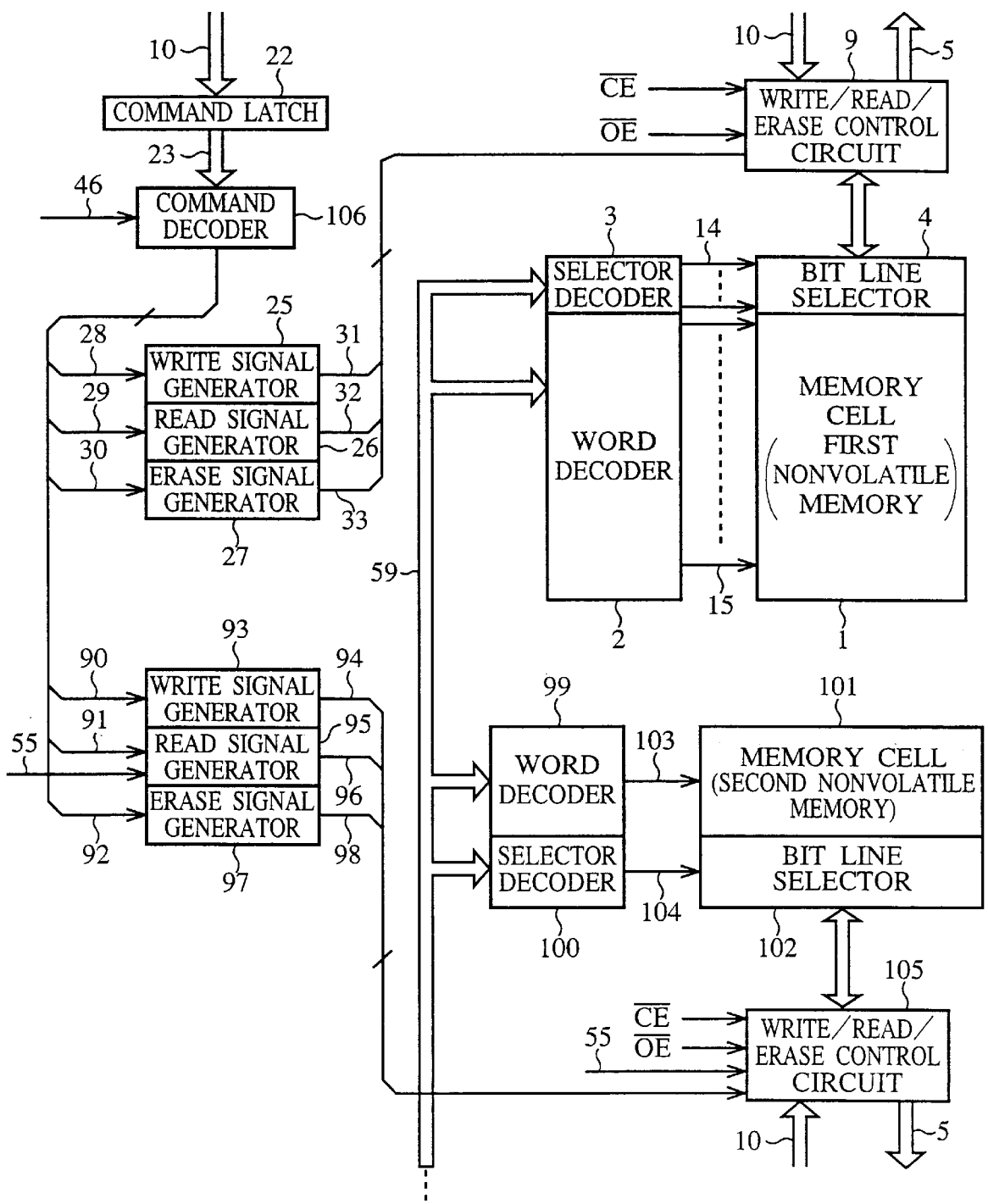
FIG. 13 is a block diagram illustrating part of the configuration of a nonvolatile memory control circuit according to Embodiment 5 of the present invention.
Figure 14:
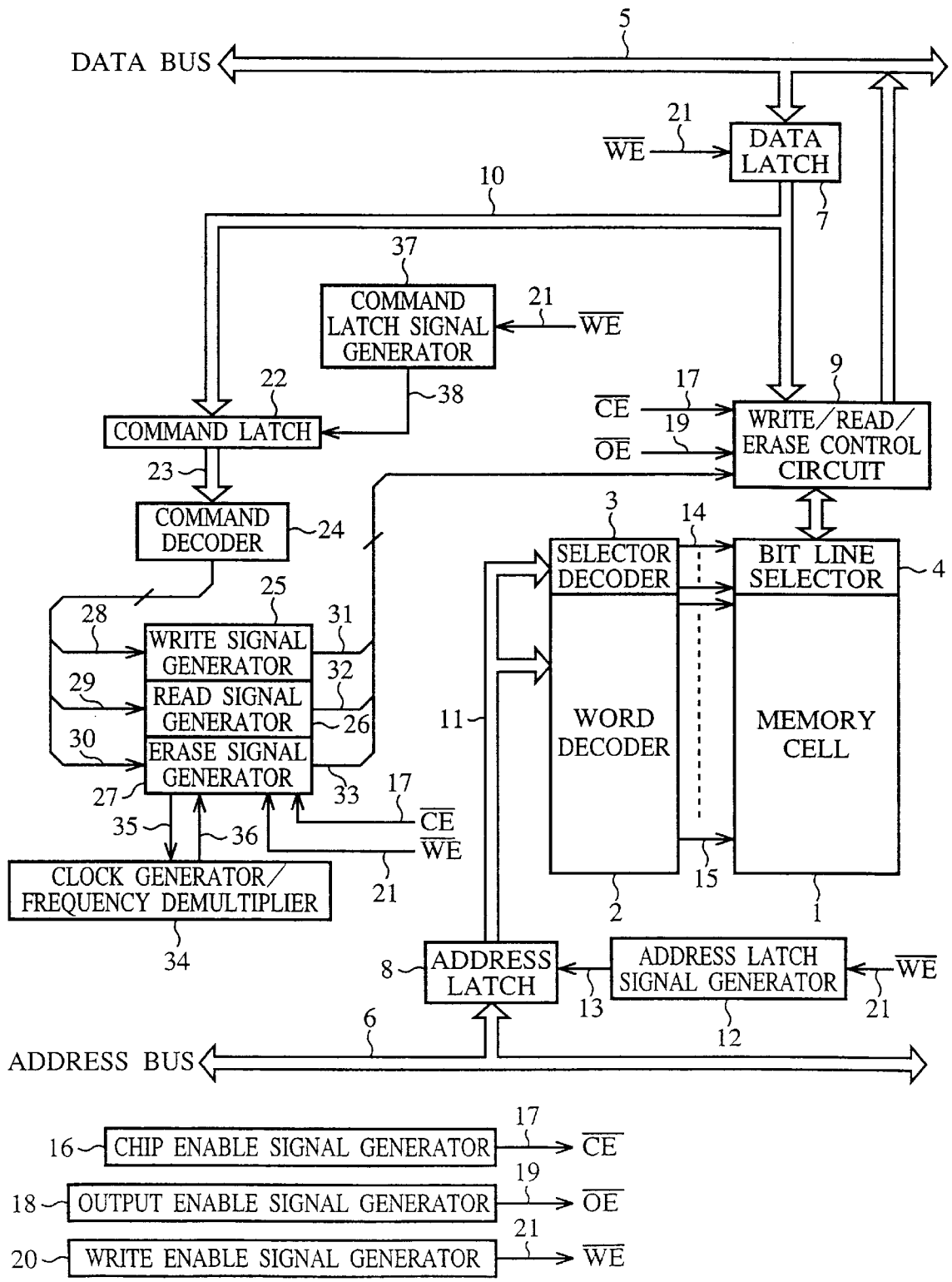
FIG. 14 is a block diagram depicting the configuration of a conventional nonvolatile memory control circuit.
Figure 15:
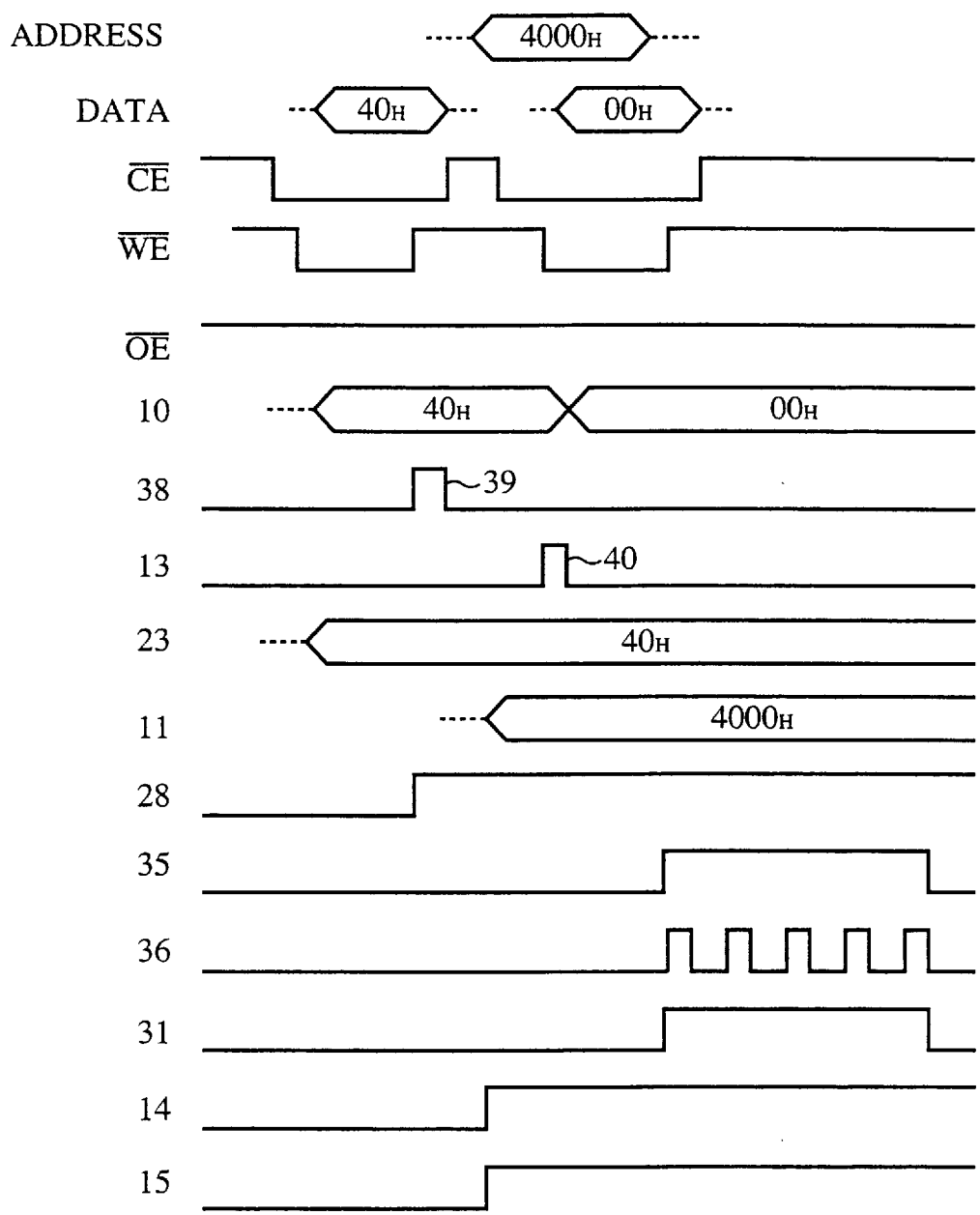
FIG. 15 is a timing chart depicting the timing for writing data in a memory cell in the conventional nonvolatile memory control circuit of FIG. 14.
Figure 16:
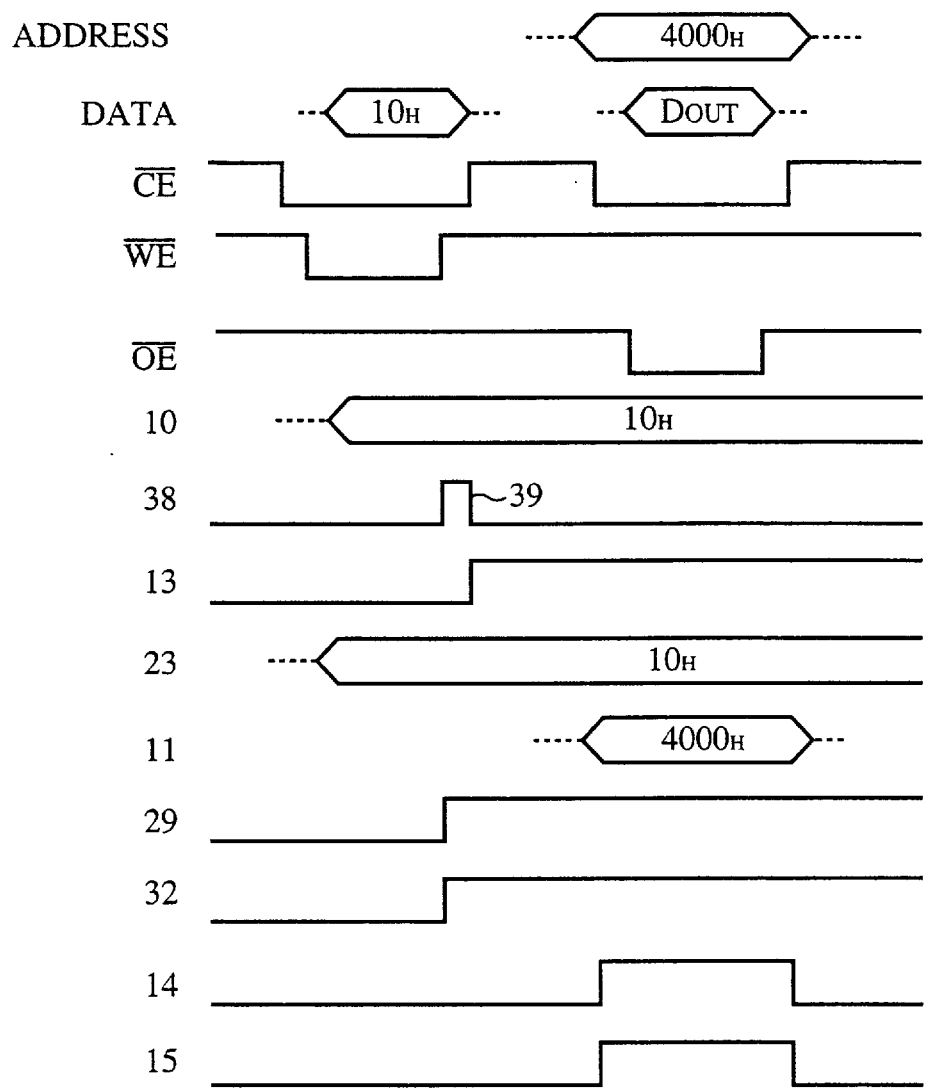
FIG. 16 is a timing chart depicting the timing for reading out data from the memory cell in the conventional nonvolatile memory control circuit of FIG. 14.

FIG. 13 illustrates in block form a nonvolatile memory control circuit according to Embodiment 5 of the present invention. In this embodiment the memory cell for the data to be stored in the operation inhibit/permit register 45 is physically separated from the memory cell 1.

In FIG. 13, reference numerals 90, 91 and 92 denote signal lines signal lines for conveying command decode signals, 93 a write signal generator for generating a write signal that instructs the writing to a memory cell of data to be stored in the operation inhibit/permit register 45, 94 a signal line for conveying the write signal, 95 a read signal generator for generating a read signal that instructs the reading from the memory cell of the data to be stored in the operation inhibit/permit register 45, 96 a signal line for conveying the read signal, 97 an erase signal generator for generating an erase signal that instructs the erasing from the memory cell of the data to be stored in the operation inhibit/permit register 45, and 98 a signal line for conveying the erase signal.

Reference numeral 99 denotes a word decoder for selecting horizontal or row addresses of the memory cell for the data to be stored in the operation inhibit/permit register 45, 100 a selector decoder for decoding a bit line selector that selects vertical or column addresses of the memory cell for the data to be stored in the operation inhibit/permit register 45, 101 a memory cell (a second nonvolatile memory) for the data to be stored in the operation inhibit/permit register 45, 102 the bit line selector for selecting a bit line based on a selector decode signal from the selector decoder 100, 103 a signal line for conveying a word decode signal from the word decoder 99, 104 a signal line for conveying the selector decode signal from the selector decoder 100, 105 a write/read/erase control circuit (second write/read/erase means) that effects control for writing, reading or erasing data to, from and in the memory cell 101, and 106 a command decoder for deciding whether command data input thereinto via the data bus 23 is a command that instructs the writing, reading or erasing of the memory cell 1 or a command that instructs the writing, reading or erasing of the memory cell 101.

Now, the operation of this embodiment will be described below.

In Embodiments 1 through 4, the memory cell 42 for the data to be stored in the operation inhibit/permit register forms part of the memory cell 1 for normal use. Accordingly, when it is necessary to reset data once written in the memory cell 42, there is no choice but to erase the memory cell 1 over the entire area thereof. In Embodiment 5 the memory cell 101 for the data to be stored in the operation inhibit/permit register 45 is physically separated from the memory cell 1. And the signal generators and the write/read/erase control circuit are provided for each memory cell so that it can be written, read and erased independently of the other. The write, read and erase commands are decoded by the command decoder 106 using different command codes for the respective memory cells. The data that is stored in the operation inhibit/permit register 45 is applied only to the write/read/erase operation at the side of the memory ell 1. Hence, an operation once inhibited can be reset to its initial state for newly obtaining permission, by rewriting data in the memory cell 101.

As described above, according to Embodiment 5, even if the memory cannot be erased or written because of writing wrong data as the data for the operation inhibit/permit register 45, it is possible to write data by erasing the data written in the memory cell 101.

While in the above the preferred embodiments of the present invention have been described, it must be noted here that they are merely illustrative of the invention and should not be construed in the limiting sense. Furthermore, it will be apparent that many modification and variation may be effected without departing from the spirits and scope of the claims appended hereunto.

What is claimed is:

1. A nonvolatile memory control circuit comprising:

an electrically erasable nonvolatile memory;

write/read/erase means for writing, reading or erasing said nonvolatile memory;

address signal generating means for generating, upon power-up, an address signal that designates a predetermined address of said nonvolatile memory;

data read instructing means for generating a signal that instructs said write/read/erase means to read data from said nonvolatile memory at said predetermined address designated by said address signal from said address signal generating means; and a command decoder which decodes a command instructing the operation of said write/read/erase means and which, when said data read out of said predetermined address is data instructing inhibition of at least one of operations for writing, reading and erasing said nonvolatile memory, inhibits said at least one operation from execution.

2. A nonvolatile memory control circuit according to claim 1, further comprising a register for temporarily storing data read out by said write/read/erase means from said nonvolatile memory at said predetermined address.

3. A nonvolatile memory control circuit according to claim 1, wherein: said address signal generating means generates signals that designate first and second predetermined addresses in said nonvolatile memory; said data read instructing means generates signals that instruct reading out data from said nonvolatile memory at said first and second predetermined addresses; and when said data read out from said nonvolatile memory at said first predetermined address does not match an operator's input password, said command decoder inhibits subsequent operations for writing, reading and erasing said nonvolatile memory, and when said data read out from said nonvolatile memory at said second predetermined address is data instructing inhibition of said at least one operation, said command decoder inhibits the execution of said at least one operation.

4. A nonvolatile memory control circuit comprising:

an electrically erasable nonvolatile memory;

write/read/erase means for writing, reading or erasing said nonvolatile memory;

at least two command decoders for decoding commands of different kinds of systems that instruct the operation of said write/read/erase means; and select means for selecting one of said at least two command decoder for decoding an inputted command.

5. A nonvolatile memory control circuit comprising:

a first electrically erasable nonvolatile memory;

first write/read/erase means for writing, reading or erasing said first nonvolatile memory;

a second electrically erasable nonvolatile memory;

second write/read/erase means for writing, reading or erasing said second nonvolatile memory;

address signal generating means for generating, upon power-up, an address signal that designates a predetermined address of said second nonvolatile memory;

data read instructing means for generating a signal that instructs said second write/read/erase means to read data from said second nonvolatile memory at said predetermined address designated by said address signal from said address signal generating means; and a command decoder which decodes commands instructing the operation of said first and second write/read/erase means and which, when said data read out of said predetermined address is data instructing inhibition of at least one of operations for writing, reading and erasing said first nonvolatile memory, inhibits said at least one operation from execution.

* * * * *